(12) United States Patent
Huang et al.

(10) Patent No.: US 8,679,728 B2
(45) Date of Patent: Mar. 25, 2014

(54) METHOD FOR FABRICATING PATTERNED LAYER

(71) Applicant: National Applied Research Laboratories, Taipei (TW)

(72) Inventors: Chien-Chao Huang, Hsinchu (TW); Chun-Chi Chen, Hsinchu (TW); Shyi-Long Shy, Hsinchu (TW); Cheng-San Wu, Hsinchu (TW); Fu-Liang Yang, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 2753 days.

(21) Appl. No.: 13/684,019

(22) Filed: Nov. 21, 2012

(65) Prior Publication Data
US 2013/0084530 A1   Apr. 4, 2013

Related U.S. Application Data

(63) Continuation-in-part of application No. 12/620,418, filed on Nov. 17, 2009, now abandoned.

(51) Int. Cl.
*G03F 7/20* (2006.01)
*G03C 5/00* (2006.01)

(52) U.S. Cl.
USPC ............ 430/296; 430/328; 430/394; 430/942

(58) Field of Classification Search
USPC .................................. 430/296, 328, 394, 942
See application file for complete search history.

(56) References Cited

U.S. PATENT DOCUMENTS

| | | | |
|---|---|---|---|
| 5,420,067 A | 5/1995 | Hsu | |
| 5,549,780 A | 8/1996 | Koinuma et al. | |
| 5,804,980 A | 9/1998 | Nikawa | |
| 5,824,456 A * | 10/1998 | Ogi et al. | 430/325 |
| 6,093,246 A | 7/2000 | Lin et al. | |
| 6,787,783 B2 | 9/2004 | Marchman et al. | |
| 2007/0210393 A1 | 9/2007 | Rehspringer et al. | |
| 2008/0304522 A1 | 12/2008 | Mills | |

FOREIGN PATENT DOCUMENTS

EP   1 617 290   1/2006

OTHER PUBLICATIONS

McCallum et al., "Integration considerations for 193nm photoresists" Microelectronic Engineering, 1999, pp. 335-338, vol. 46.
Meador et al., "New materials for 193-nm trilayer imaging" Proc. SPIE, 2004, pp. 1138-1146, vol. 5376.
Bieber et al., "Applications of Electron Beam Induced Deposition in Nanofabrication" Proceedings of the 7th International Caribbean Conference on Devices, Circuits and Systems, Apr. 28-30, 2008, Mexico.
Hubner et al., "On-line nanolithography using electron beam-induced deposition technique" Microelectronic Engineering, 2001, pp. 953-958, vol. 57-58.
Kohlmann-Von Platen et al., 'Electron-beam induced tungsten deposition: Growth rate enhancement and applications in microelectronics', Proceedings of the 36th International Symposium on electron, iron, and photon beams, 1992, pp. 2690-2694, vol. 10.

* cited by examiner

*Primary Examiner* — Christopher Young
(74) *Attorney, Agent, or Firm* — Muncy, Geissler, Olds & Lowe, P.C.

(57) ABSTRACT

A method for fabricating a patterned layer is disclosed. Firstly, a semiconductor substrate is provided. Then, a precursory gas on the semiconductor substrate is formed. Finally, a patterned layer on the semiconductor substrate is deposited by reacting the precursory gas with at least one electron beam or at least one ion beam. The present invention not only fabricates a patterned layer on the substrate in a single step but also achieves a high lithographic resolution and avoids remains of contaminations by using the properties of the electron beam or the ion beam and the precursory gas.

20 Claims, 22 Drawing Sheets

METHOD FOR FABRICATING PATTERNED LAYER

RELATED APPLICATIONS

The present invention is a continuous-in-part application of the application that is entitled "LITHOGRAPHIC MACHINE PLATFORM AND APPLICATIONS THEREOF" (U.S. application Ser. No. 12/620,418), which is filed presently with the U.S. Patent & Trademark Office, and which is used herein for reference in its entirety.

BACKGROUND OF THE INVENTION

1. Field of the Invention

The present invention relates to a fabrication method, particularly to a method for fabricating a patterned layer.

2. Description of the Related Art

Presently, in a advanced lithographic fabrication process, patterns are generated by using an optical method, an electron beam, a nano impression method on a specific polymer coating layer (namely, the polymer material that is sensitive to lights or electron beams), also called resist, through chemical reactions or variations of thermal current stress and then used as a required mask when the subsequent pattern is transferred. But the resist usually requires complicated thermal treatment, exposure and development or the hull release fabrication process. Besides, for the lithography technology with a high resolution, a thickness of the resist is not enough for consumption of the subsequent etching fabrication processes, and the resist further requires the bottom anti-reflection coating layer (BARC) in the optical lithography technology and the anti-etching film used as a mask, such as a silicon oxynitride hard mask. Therefore, many films need to be deposited, treated and etched. For example, refer to FIG. 1 showing the etching mask layer of the advanced immersion lithography fabrication process now. In order to sustain the consumption of the subsequent etching fabrication processes, the etching mask layer 10 comprises two hard masks (ACL/SiON) 12、14, a bottom anti-reflection coating layer 16, and a polymer coating layer 18. After the etching mask layer 10 is implemented with an exposure fabrication process, the polymer coating layer 18 is sequentially implemented with a post-exposure bake, a development and a hard baking fabrication process, and then the anti-reflection layer 16 and the hard mask layer 12 are etched, then the polymer coating layer 18 and the anti-reflection layer 16 are removed. Finally, the substrate 19 is etched. In other words, this procedure has to go through 11 steps. As such this procedure is quite complicated and time-consuming. When a process is added to this procedure, the possibility of abnormal fabrication process and products having defects is increased, and thus the production yield is decreased.

In view of the problems and shortcomings of the prior art, the present invention provides a method for fabricating a patterned layer, so as to solve the afore-mentioned problems of the prior art.

SUMMARY OF THE INVENTION

The primary objective of the present invention is to provide a method for fabricating a patterned layer, whereby using an electron beam or an ion beam to induce a precursory gas or a precursory layer to react with the electron beam or the ion beam, and the precursory gas or the precursory layer is deposited to form a patterned layer with high resolution on a substrate lest a photo resistance used as a medium for a pattern transformation be required in the conventional lithographic fabrication process.

Another objective of the present invention is to provide a method for fabricating a patterned layer, wherein a precursory gas is not reacted with the undefined (un-irradiated) regions of an electron beam or an ion beam to generate deposition (residual). On the contrary, the existing advanced immersion lithography is moistened and stuck by an immersion liquid to create residual and contaminations.

Further objective of the present invention is to provide a method for fabricating a patterned layer, wherein not only number of the steps of the lithographic fabrication process and the fabrication cost can be reduced but abnormal fabrication processes and production defects caused by the minute and complicated fabrication process steps can be reduced, and then the production yield is increased.

To achieve the abovementioned objectives, the present invention provides a method for fabricating a patterned layer, which comprises steps of providing a semiconductor substrate; forming a precursory gas on the semiconductor substrate; and forming a patterned block on the semiconductor substrate by reacting the precursory gas with at least one electron beam or at least one ion beam.

The present invention also provides a method for fabricating a patterned layer comprising steps of: providing a semiconductor substrate; and forming a precursory gas on the semiconductor substrate to form a small patterned block on the semiconductor substrate by reacting the precursory gas with at least one first electron beam or at least one first ion beam, forming a photoresistant block on the semiconductor substrate, and exposing the photoresistant block to a light source to form a large patterned block.

The present invention provides a method for fabricating a patterned layer, which comprises steps of: providing a semiconductor substrate; and forming a precursory gas on the semiconductor substrate to respectively form a small patterned block and a large patterned block on the semiconductor substrate by reacting the precursory gas with at least one first electron beam and at least one second electron beam. Below, the embodiments are described in detail in cooperation with the drawings to make easily understood the characteristics, technical contents and accomplishments of the present invention.

DETAILED DESCRIPTION OF THE INVENTION

The spirit of the present invention relates to a lithographic machine platform and applications thereof, which forms a patterned layer used as a hard mask layer or other applications on a substrate by using the high lithographic properties of an electron beam or an ion beam. According to the above-mentioned description, the utilization and selection of the material of a precursory thing and a patterned layer, or the variations of process parameters are both within a spiritual scope of the present invention.

Figure 1:
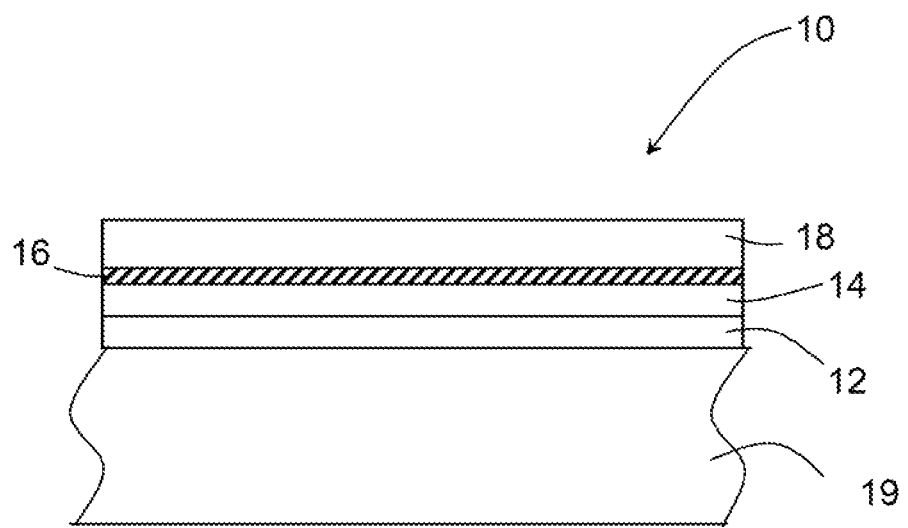
FIG. 1 is a diagram schematically showing the etching mask layer of the existing advanced immersion lithographic fabrication process.
Figure 2:
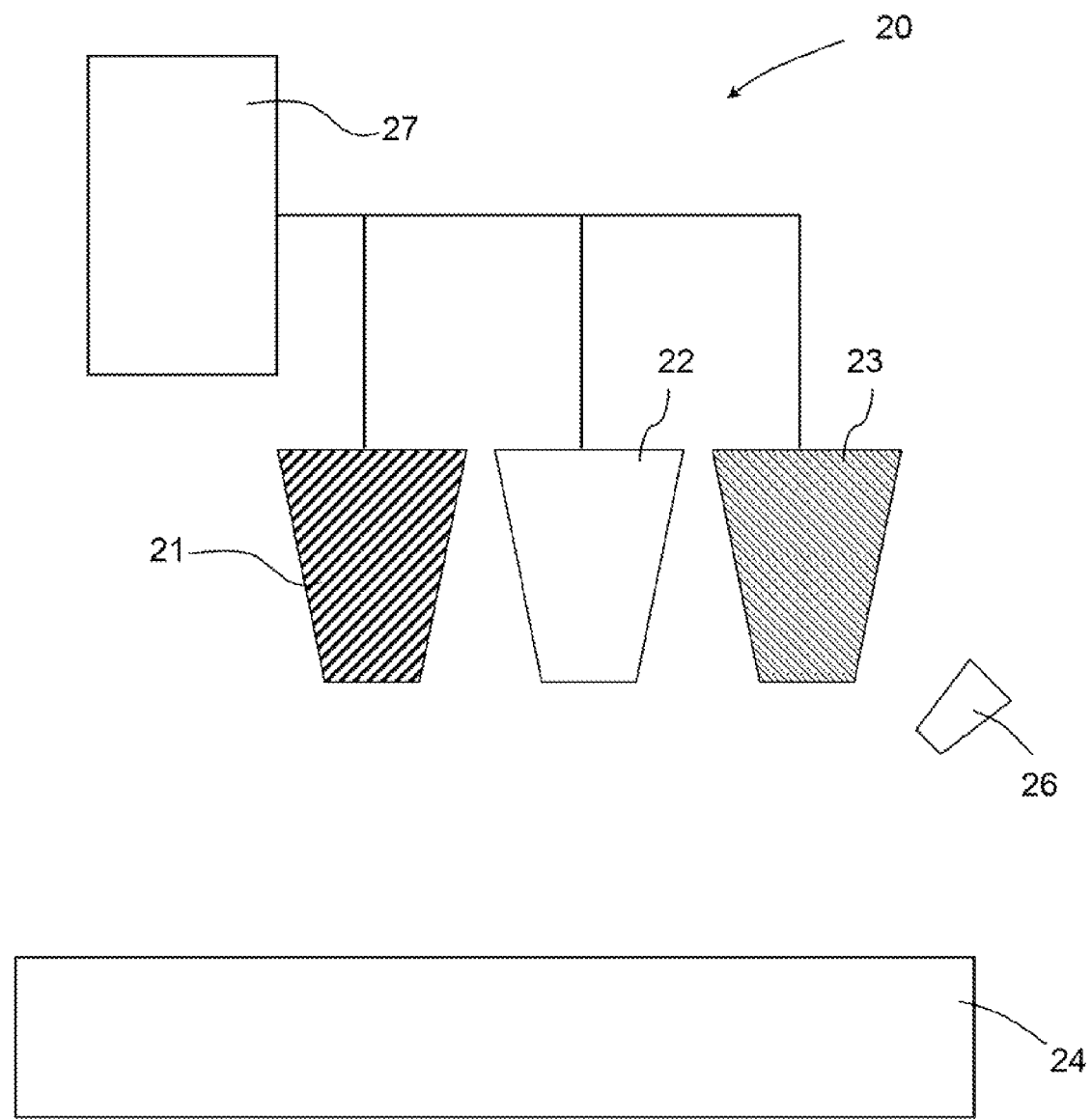
FIG. 2 is a diagram schematically showing the first configuration of the lithographic machine platform according to the present invention.

Refer to FIG. 2, which are diagrams schematically showing the first configuration of the lithographic machine platform according to the present invention. As shown in FIG. 2, an electron beam or an ion beam lithographic machine platform 20 of the present invention comprises: at least one first electron beam or at least one first ion beam generator 21 generating at least one first electron beam or at least one first ion beam; a light generator 22 generating the light, such as a second electron beam, a second ion beam, or a Ultraviolet (UV) light; at least one second electron beam generator 23 generating at least one second electron beam; a substrate supporting platform 24 positioned below the electron beam generator or the ion beam generator 21, the light generator 22 and the second electron beam 23; and a precursory gas injector 26 injecting a gas, which is applied to react with the first electron beam or the first ion beam generated by the electron beam or the ion beam generator 21. In the embodiment, the number of the first electron beam, the first ion beam, or the second electron beam generated by the second electron beam 23 is one, which is used as an example. Besides, a laser localization system 27 is connected with the first electron beam or first ion beam generator 21, the light generator 22, and the second electron beam generator 23 to control the projection direction of the first electron beam or the first ion beam, and the light and the second electron beam.

Figure 3:
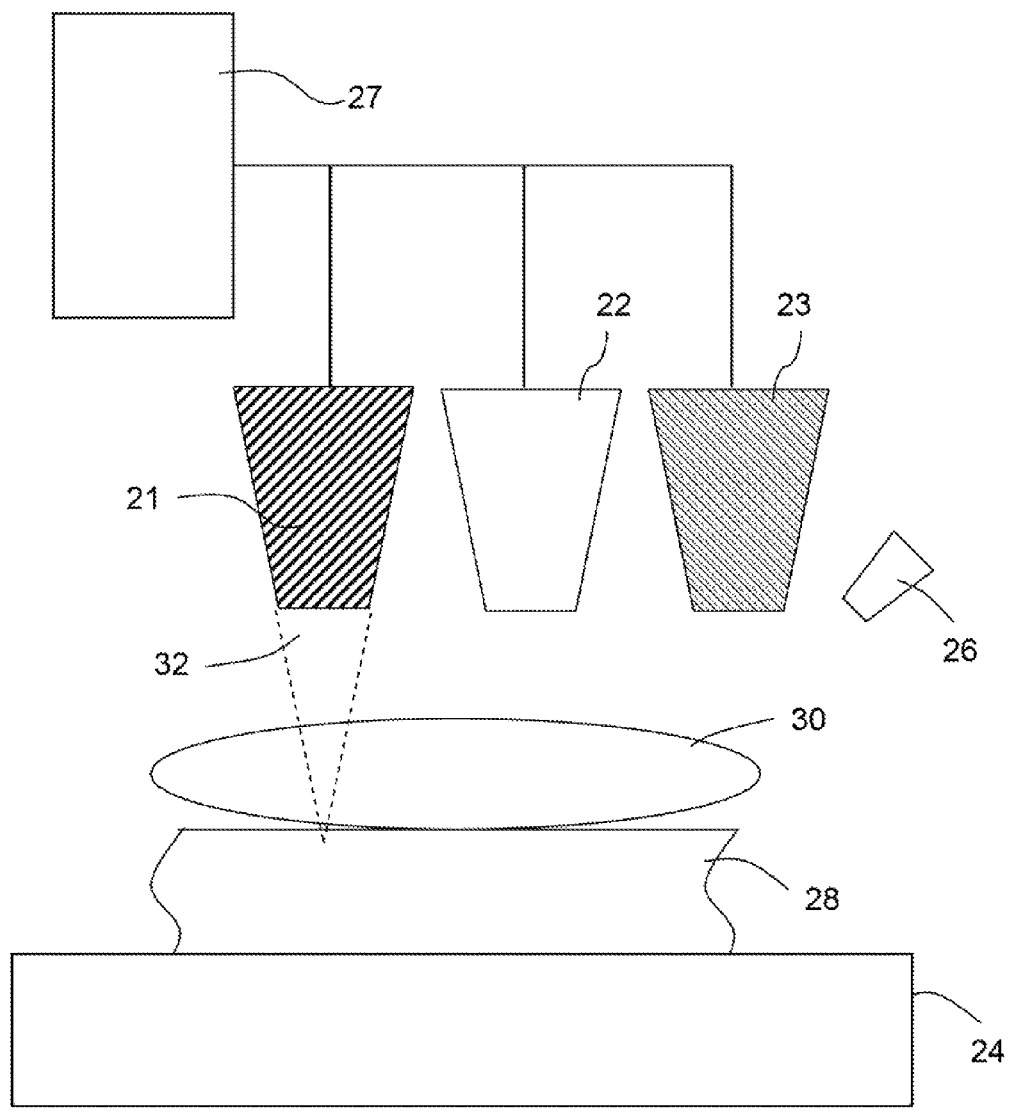
FIG. 3(a)-3(e) are diagrams schematically showing the steps of fabricating a small patterned block and a large patterned block by using the first configuration of the lithographic machine platform according to the first embodiment of the present invention.
Figure 3:
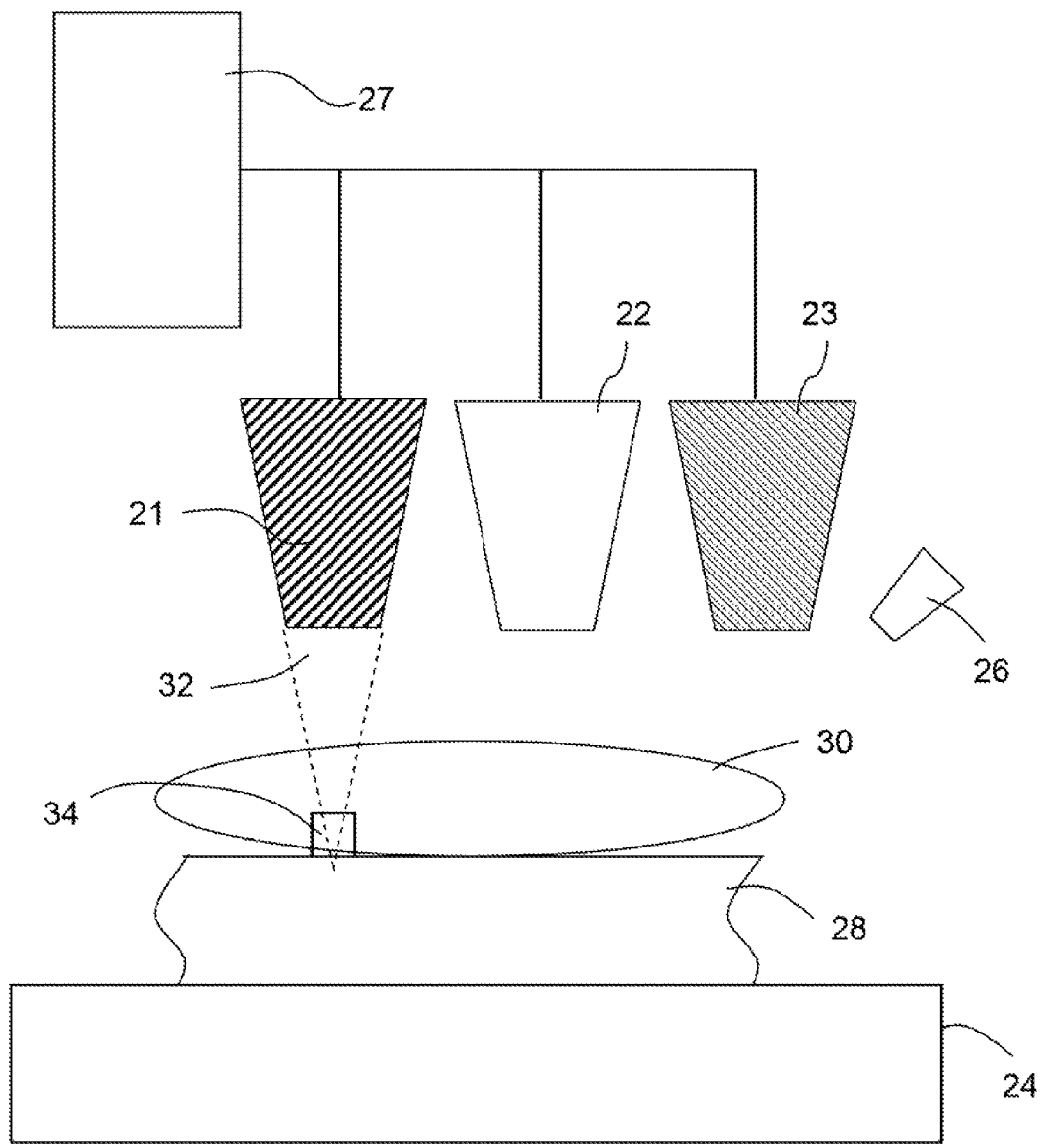
Figure 3:
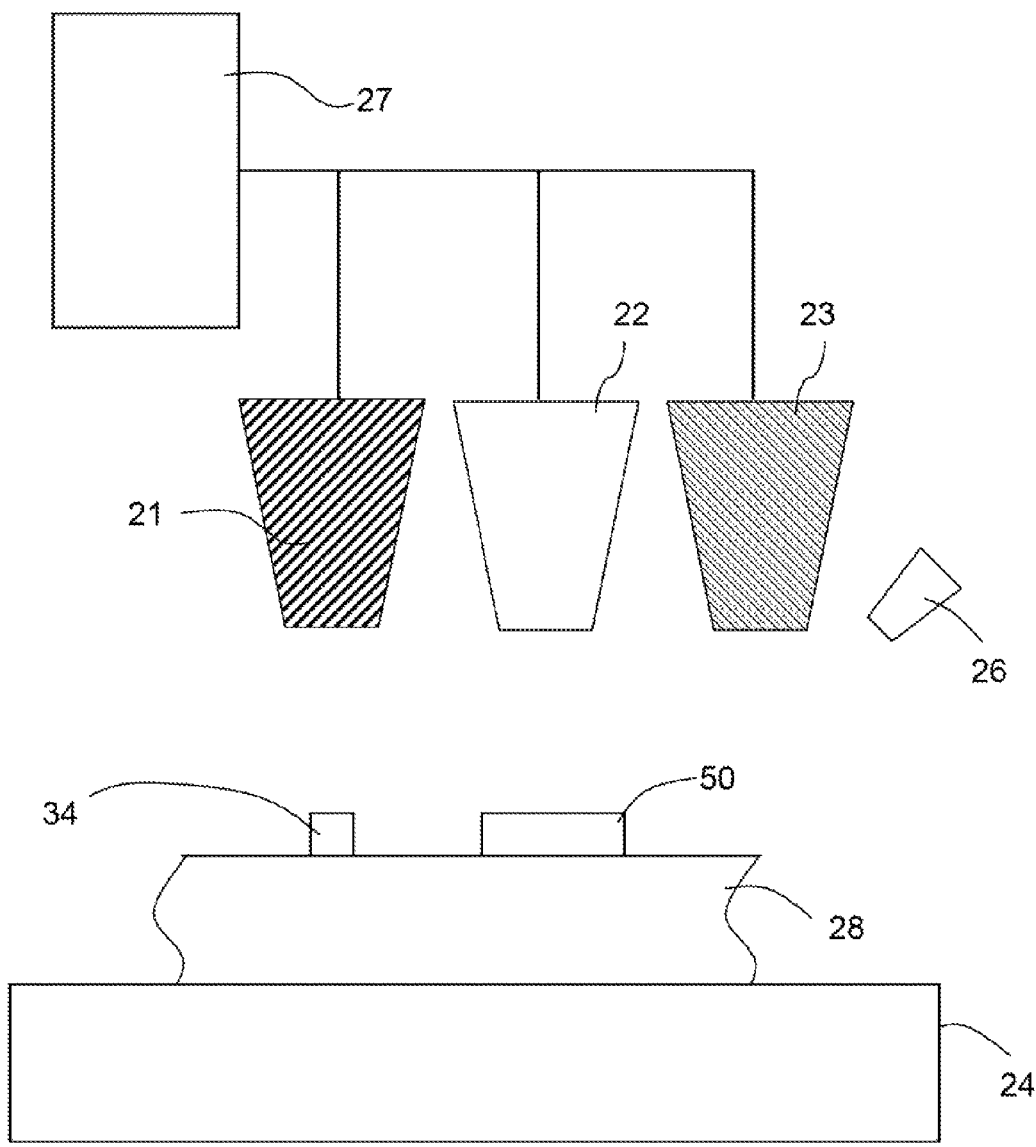
Figure 3:
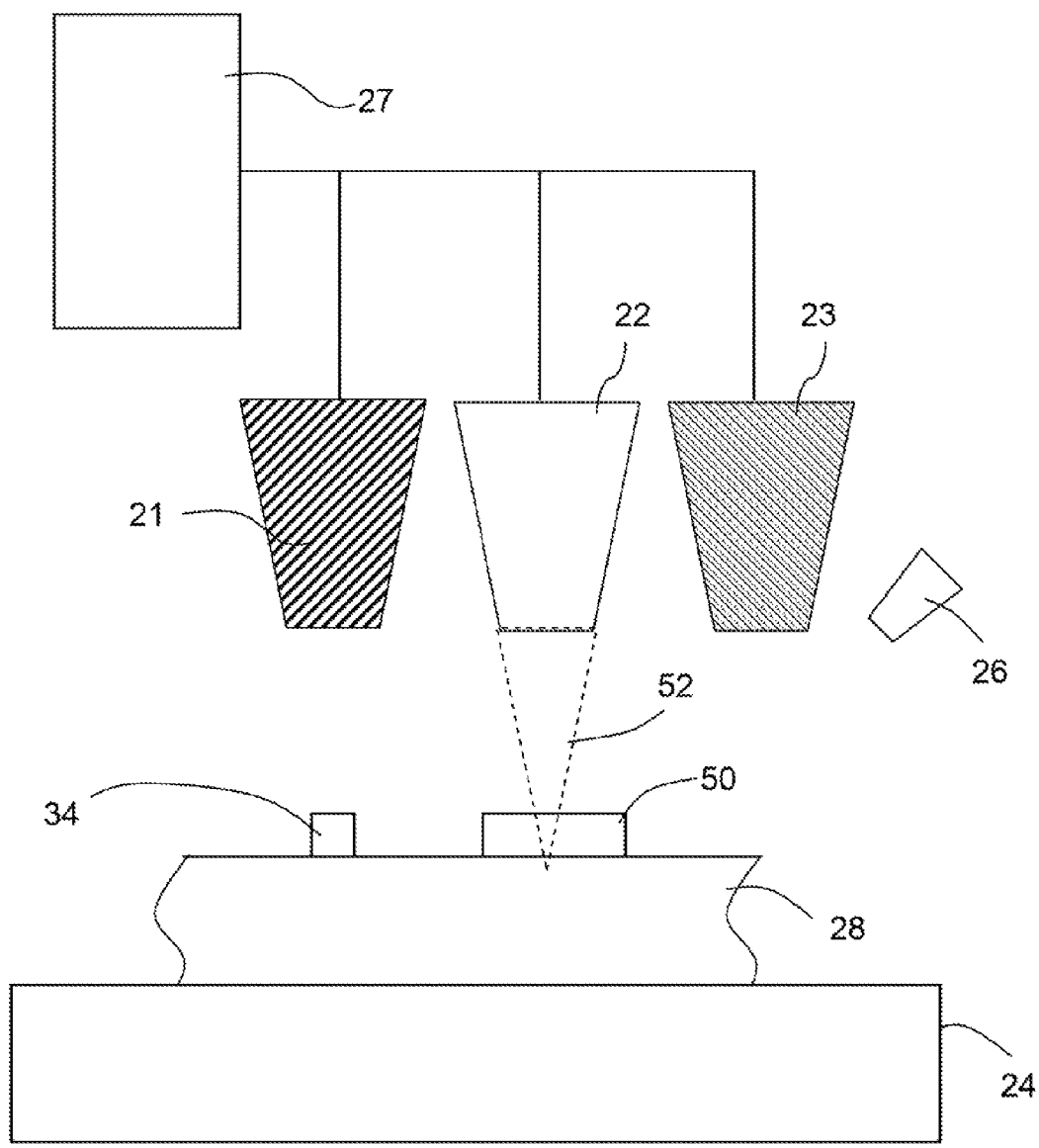
Figure 3:
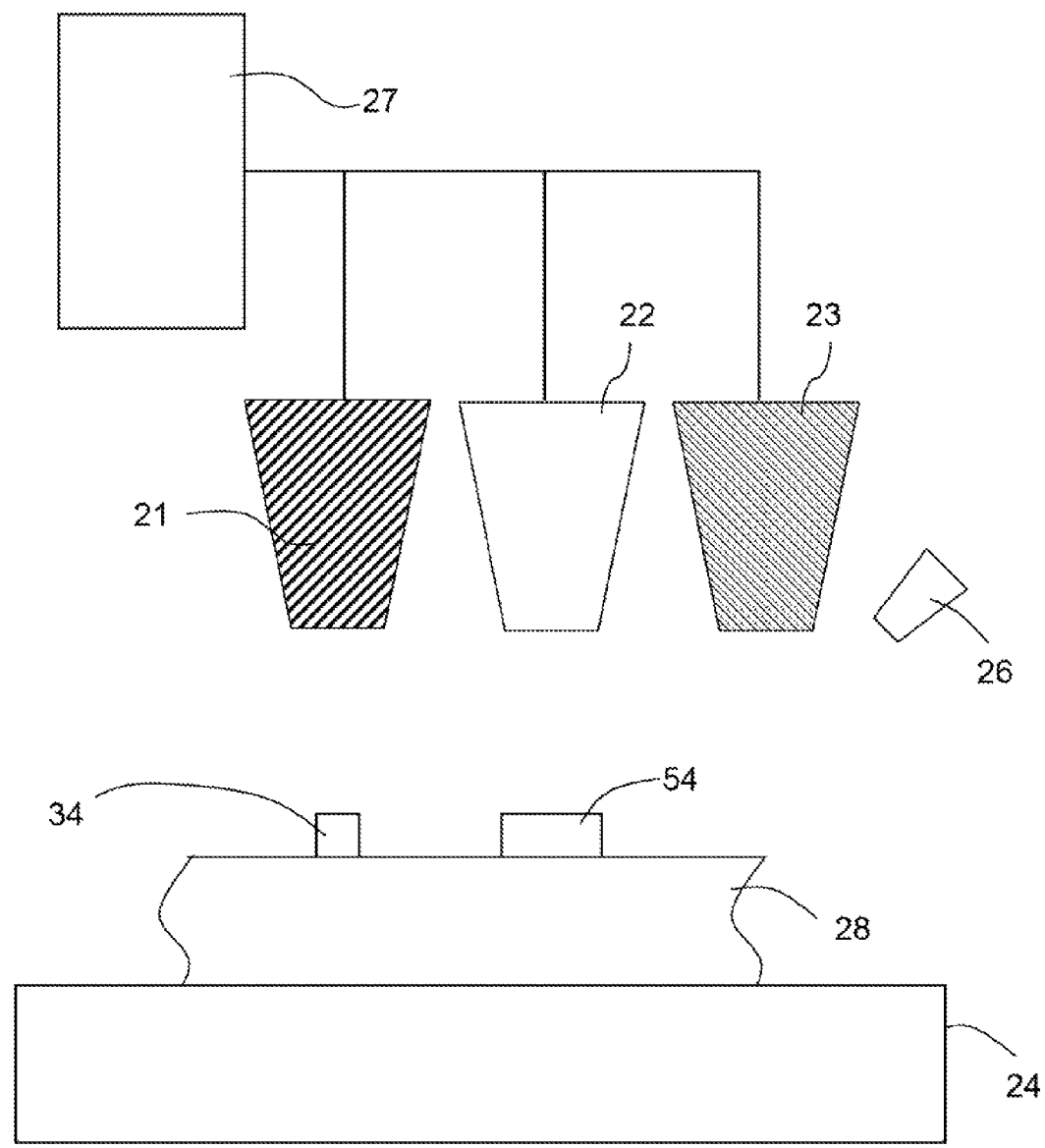

Next, refer to FIG. 3(a)-3(b), which are diagrams schematically showing the steps of fabricating a patterned layer used as a hard mask layer by using the first configuration of the lithographic machine platform according to the present invention. Below is the description of the first embodiment of the present invention. Firstly, as shown in FIG. 3(a), a semiconductor substrate 28 supported on the substrate supporting platform 24 is provided, wherein the substrate is selected from a silicon substrate, a germanium substrate, a substrate consisting of III-V group chemical compounds, or a substrate consisting of II-VI group chemical compounds. Next, a precursory gas 30 is injected above the substrate 28 by using the precursory injector 26, wherein the precursory gas 30 is selected from a precursory gas comprising metals or a precursory gas comprising a dielectric layer. Next, the laser localization system 27 controls the projection direction of the first electron beam or the first ion beam 32 generated by the electron beam or the ion beam generator 21, such that the first electron beam or the first ion beam 32 depends on a preset and defined patterns to react with the precursory gas 30 selectively, and then the precursory gas 30 is induced to be formed on the substrate 28. Finally, as shown in FIG. 3(b), a small patterned block 34 used as a hard mask is formed on the substrate 28. In other words, the defined pattern deposition only can be achieved in a step. Next, a pattern of the small patterned block 34 is transferred to the substrate 28 by a dry-etching technology. The small patterned block 34 has the smallest width of less than 50 nm.

In the abovementioned process, there is a plurality of first electron beams or first ion beams, and the speed of forming the small patterned block is increased multiple times.

Whether the precursory gas 30 is able to form deposition depends on a reactive energy given to the precursory gas 30 by the electron beam or the ion beam according to the scanning frequency and the staying time of a fixed point on a region of the preset and defined patterns. And the material of the small patterned block 34 depends on a type of the precursory gas 30, wherein the small patterned block 34 is a metal block comprising platinum, wolfram, titanium, or tantalum, and the small patterned block 34 is also a dielectric layer comprising silicon dioxide, silicon nitride, or silicon carbide.

When the precursory gas is induced to deposit by the electron beam or the ion beam, the precursory gas has the lithographic resolution and high precision pattern transformation of the electron beam or the ion beam lest a photo resistance used as a medium for a pattern transformation be required in the conventional lithographic fabrication process. Besides, the precursory gas is not reacted with the undefined (unirradiated) regions of the electron beam or the ion beam to generate deposition (residual). On the contrary, the existing advanced immersion lithography is moistened and stuck by an immersion liquid to generate a residual and contaminations. Therefore, the method of the present invention has many advanced advantages for the aspect of controlling the yield rate. In fabricating the hard mask layer according to the embodiment, 9 steps can be eliminated as compared with the advanced immersion lithography of the prior art.

Refer to FIGS. 3(c)-3(e). In order to form a large pattern on the semiconductor substrate 28, a large patterned block with the smallest width of larger than or equal to 50 nm is formed after FIG. 3(b). As shown in FIG. 3(c), a photoresistant block 50 is formed on the semiconductor substrate 28. Next, as shown in FIG. 3(d), the photoresistant block 50 is exposed to the light 52 generated by the light generator 22. Finally, as shown in FIG. 3(e), a part of the photoresistant block 50 is removed by the light, so that a large patterned block 54 is formed on the substrate 28.

Figure 4:
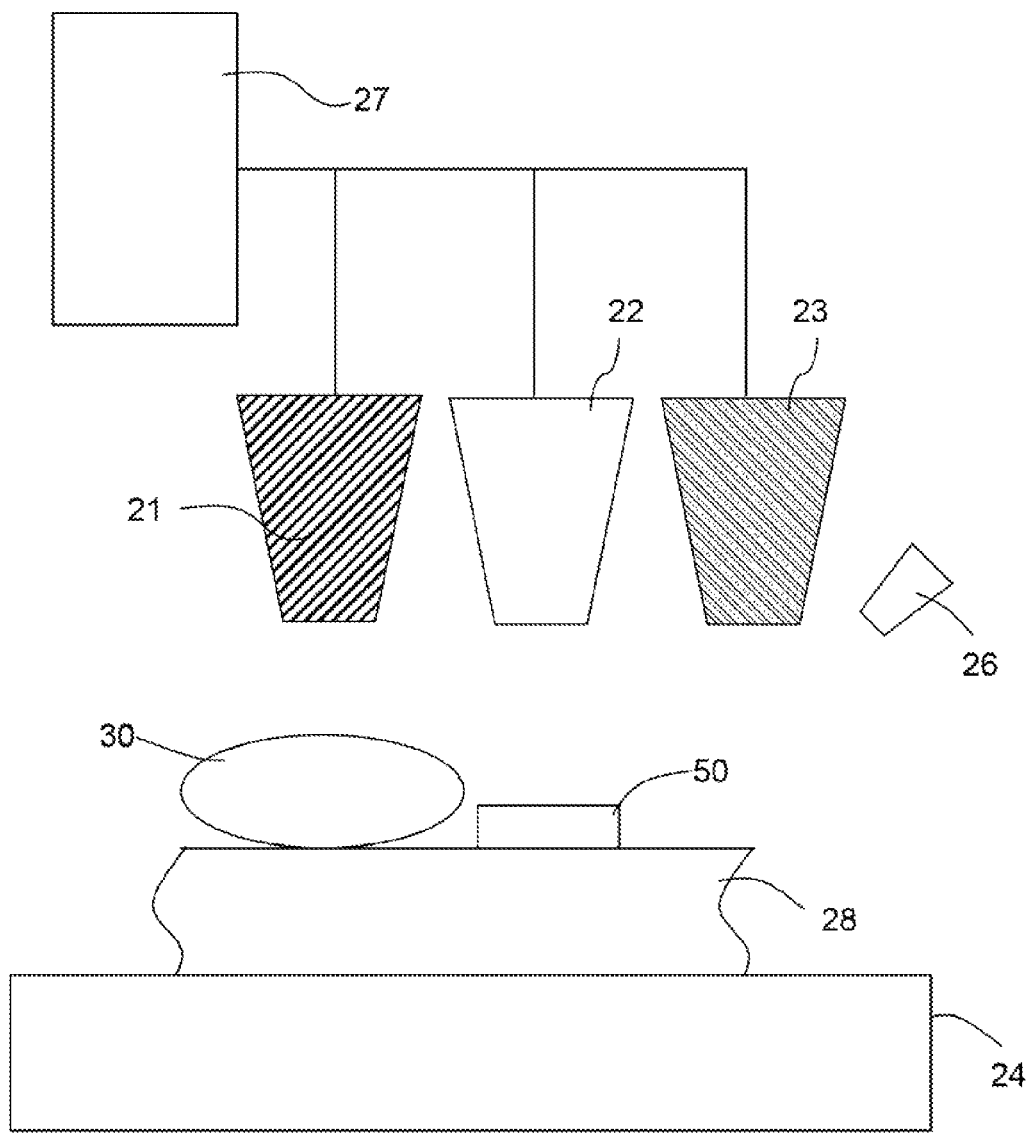
FIG. 4(a)-4(d) are diagrams schematically showing the steps of fabricating a small patterned block and a large patterned block by using the first configuration of the lithographic machine platform according to the second embodiment of the present invention.
Figure 4:
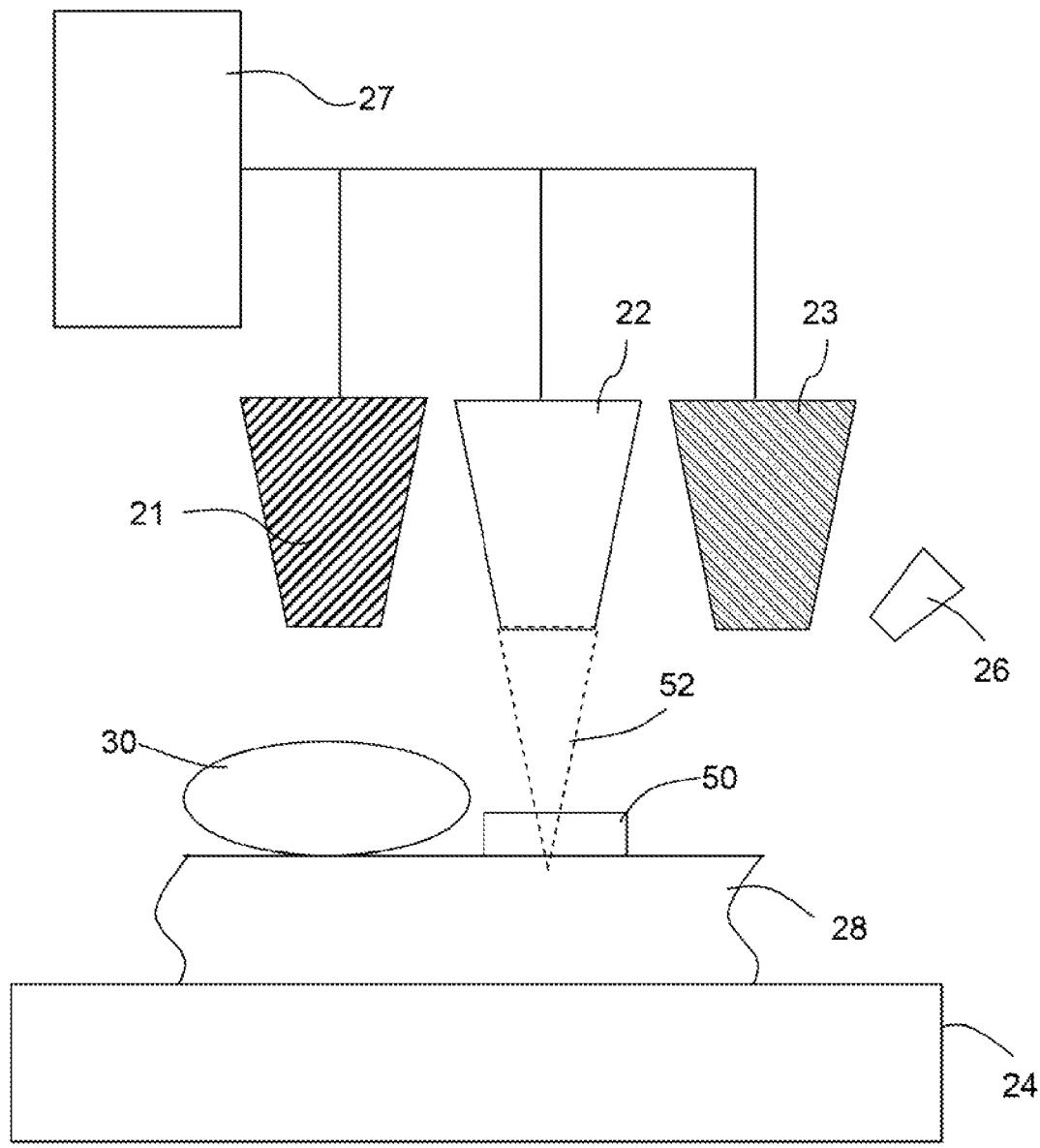
Figure 4:
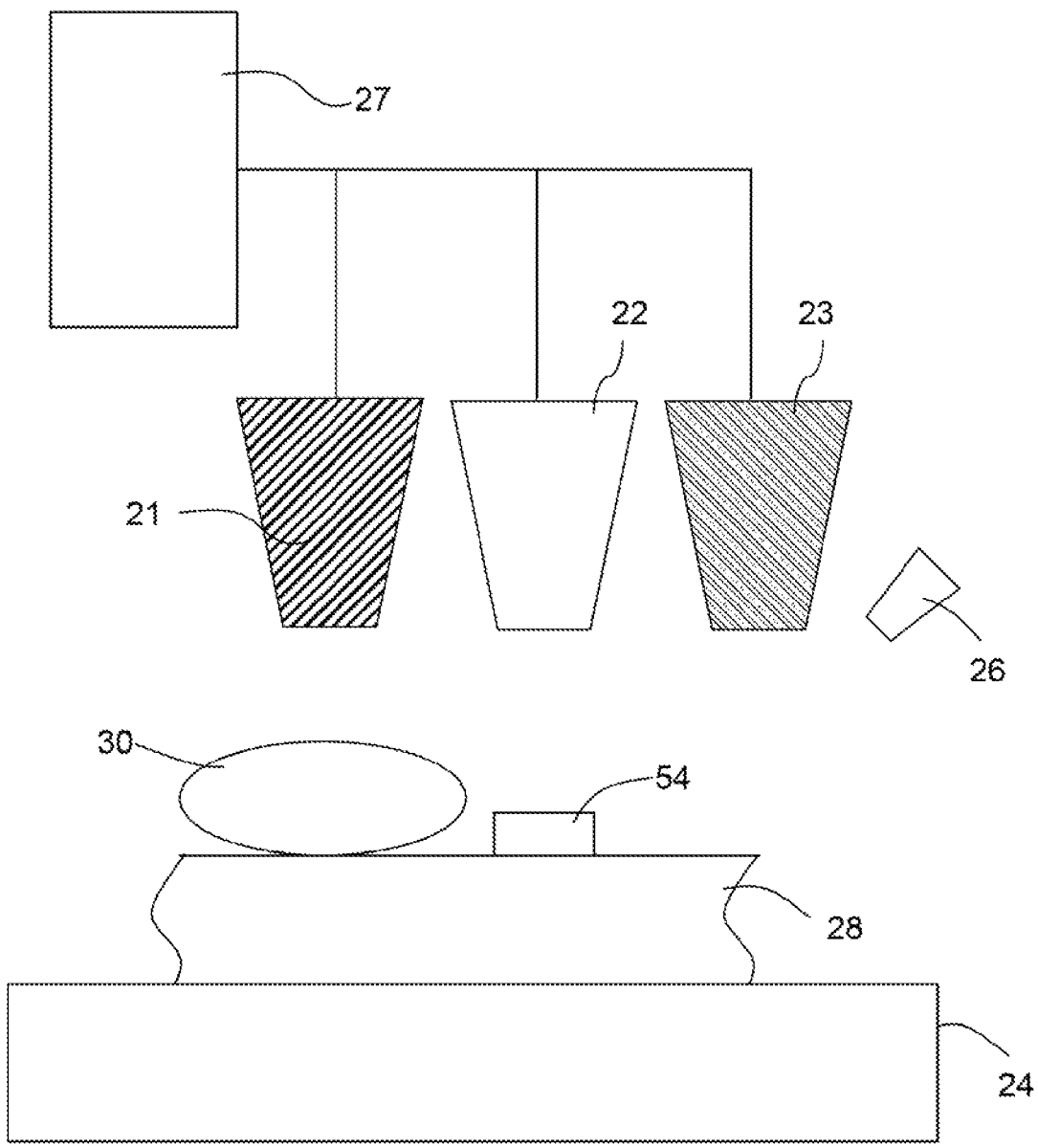
Figure 4:
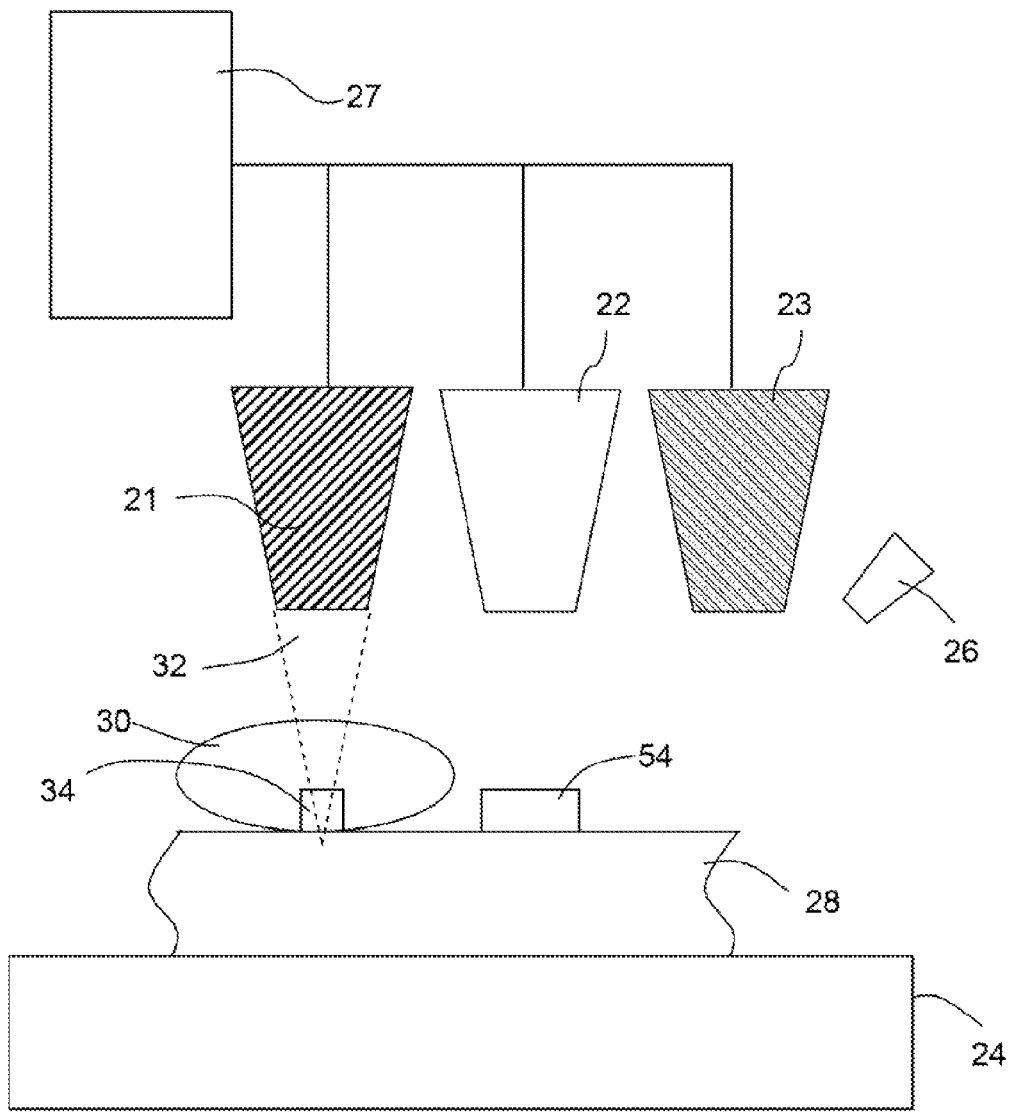

Alternatively, below is the description of the second embodiment of the present invention. Refer to FIGS. 4(a)-4(d). Firstly, as shown in FIG. 4(a), the semiconductor substrate 28 supported on the substrate supporting platform 24 is provided, and then the precursory gas 30 is formed on the semiconductor substrate 28. Then, the photoresistant block 50 is formed on the semiconductor substrate 28. Next, as shown in FIG. 4(b), the photoresistant block 50 is exposed to the light 52 generated by the light generator 22. Next, as shown in FIG. 4(c), a part of the photoresistant block 50 is removed by the light, so that the large patterned block 54 is formed on the substrate 28. Finally, as shown in FIG. 4(d), the small patterned block 34 is formed on the semiconductor substrate 28 by reacting the precursory gas 30 with the first electron beam or the first ion beam 32.

Figure 5:
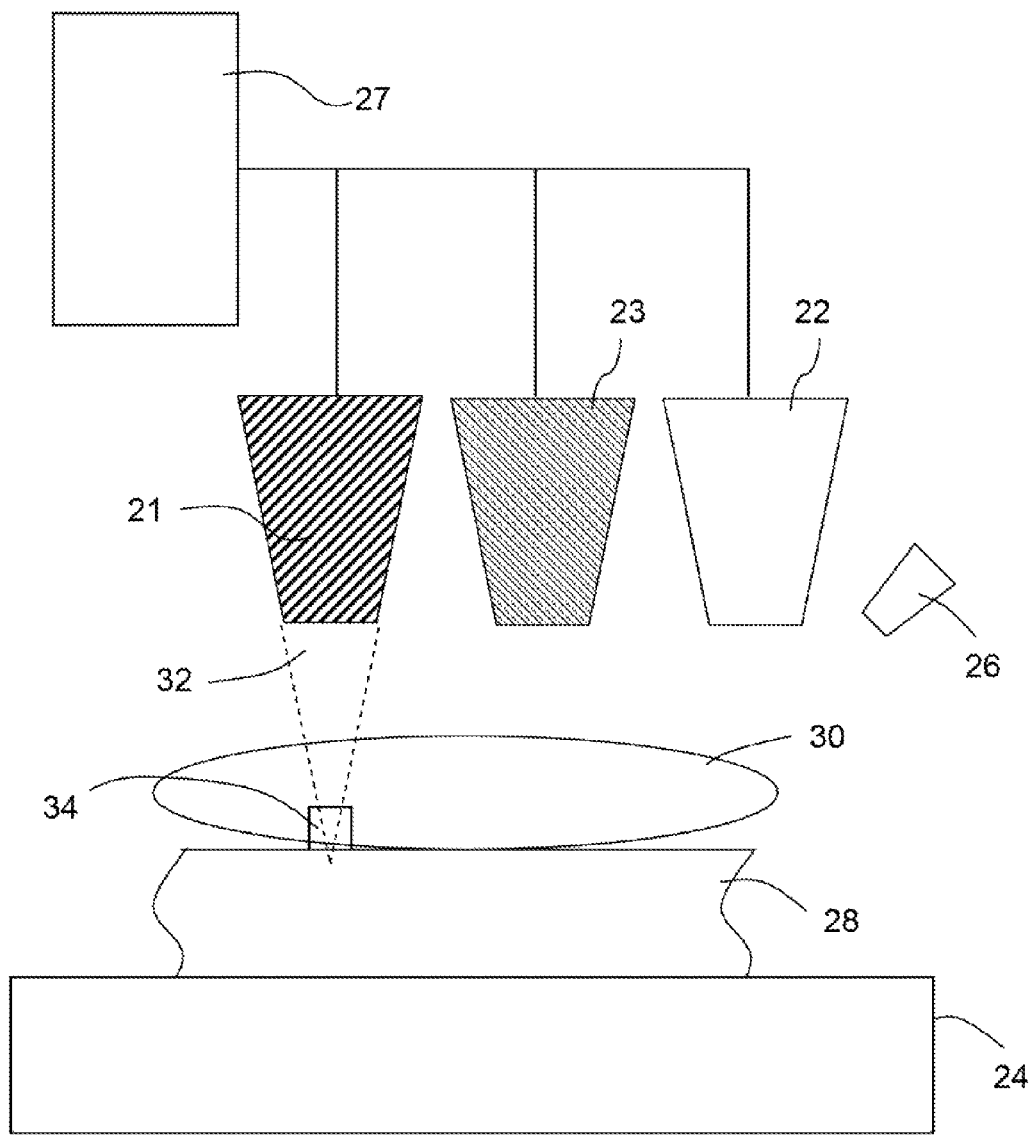
FIG. 5(a)-5(b) are diagrams schematically showing the steps of fabricating a small patterned block and a large patterned block by using the first configuration of the lithographic machine platform according to the third embodiment of the present invention.
Figure 5:
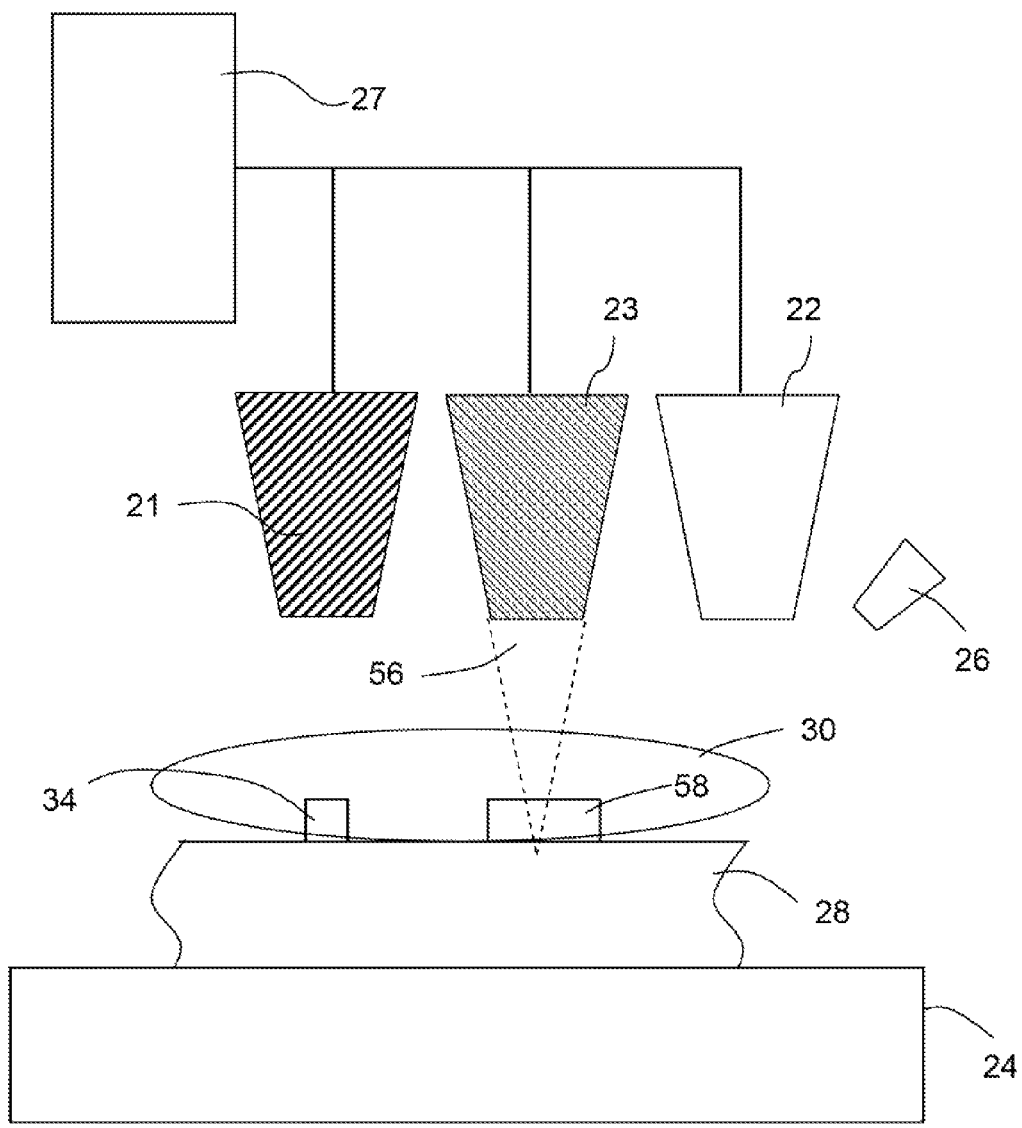

Below is the description of the third embodiment of the present invention. Refer to FIGS. 5(a)-5(b). Firstly, as shown in FIG. 5(a), the semiconductor substrate 28 supported on the substrate supporting platform 24 is provided, and then the precursory gas 30 is formed on the semiconductor substrate 28 to form the small patterned block 34 on the semiconductor substrate 28 by reacting the precursory gas 30 with the first electron beam 32. The resolution of the first electron beam 32 is smaller than 50 nm. Next, as shown in FIG. 5(b), the large patterned block 58 is formed on the semiconductor substrate 28 by reacting the precursory gas 30 with the second electron beam 56 generated by the second electron beam generator 23. The resolution of the second electron beam 56 is not smaller than 50 nm.

Figure 6:
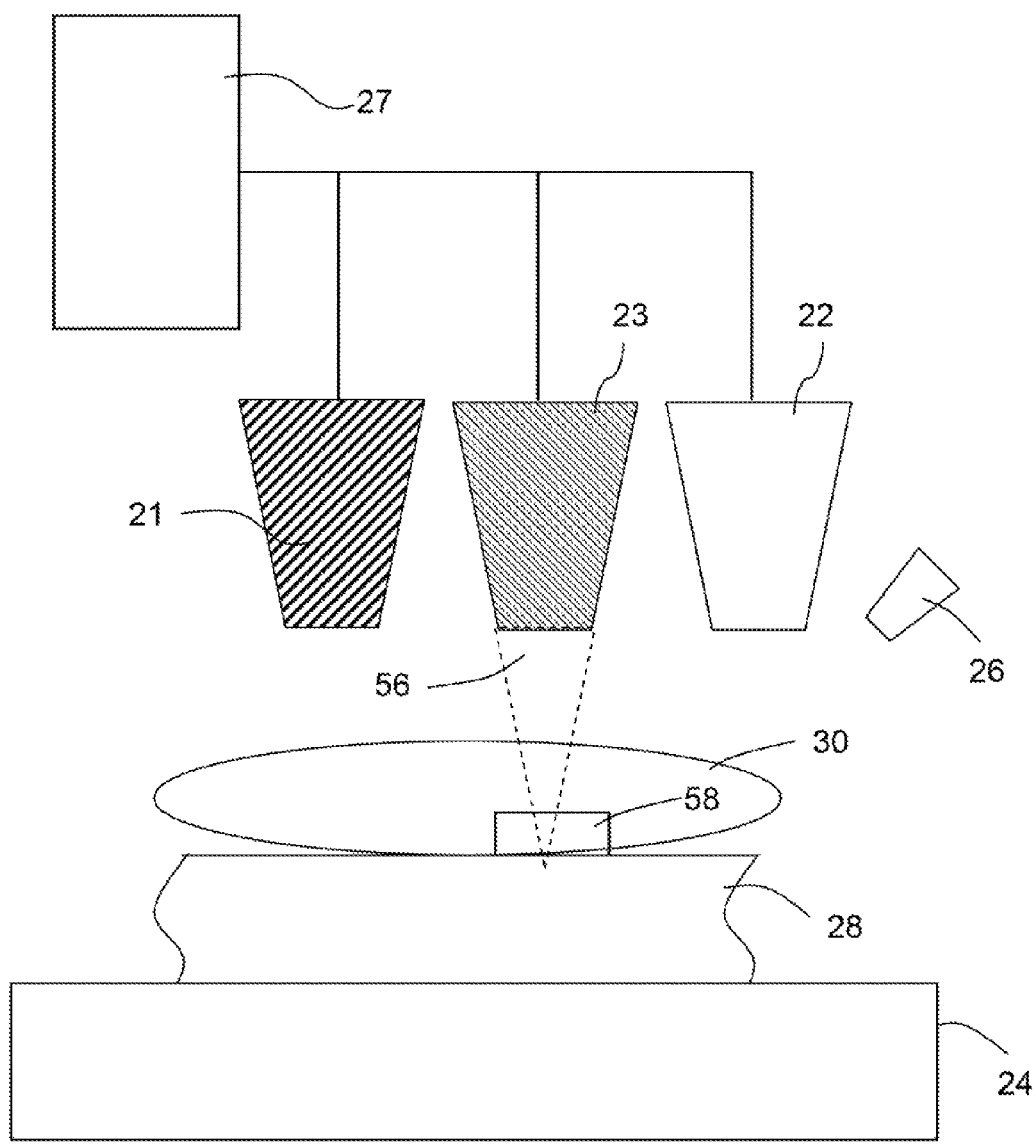
FIG. 6(a)-6(b) are diagrams schematically showing the steps of fabricating a small patterned block and a large patterned block by using the first configuration of the lithographic machine platform according to the fourth embodiment of the present invention.
Figure 6:
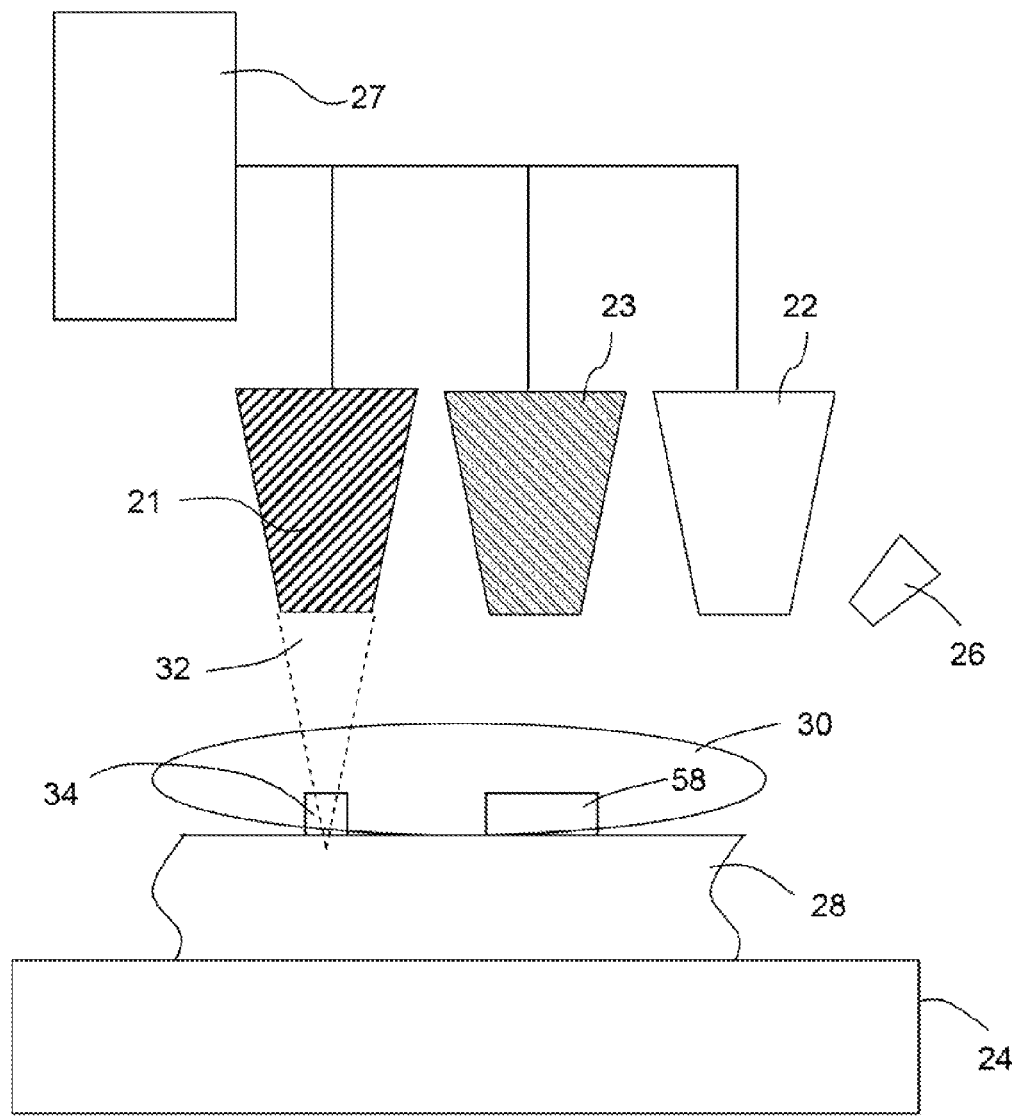

Below is the description of the fourth embodiment of the present invention. Refer to FIGS. 6(a)-6(b). Firstly, as shown in FIG. 6(a), the semiconductor substrate 28 supported on the substrate supporting platform 24 is provided, and then the precursory gas 30 is formed on the semiconductor substrate 28 to form the large patterned block 58 on the semiconductor substrate 28 by reacting the precursory gas 30 with the second electron beam 56 generated by the second electron beam generator 23. Next, as shown in FIG. 6(b), the small patterned block 34 is formed on the semiconductor substrate 28 by reacting the precursory gas 30 with the first electron beam 32.

Figure 7:
FIG. 7 is an electron microscope photograph of a gate layer pattern of SRAM formed by a deposited hard mask layer reacted with an electron beam or an ion beam, which are generated by using the first configuration of the lithographic machine platform according to the present invention.

Refer to FIG. 7, which is an electron microscope photograph of a gate layer pattern of SRAM formed by a deposited hard mask reacted with the electron beam or the ion beam, which are generated by using the first configuration of the lithographic machine platform according to the present invention. In this embodiment, the substrate and the precursory gas are a silicon substrate and a gas comprising platinum respectively, and the substrate is grounded though a conductive copper adhesive tape. The correlation parameters of the electron beam or the ion beam comprises a accelerator voltage value, a current value, a scanning pass value, a staying time of a defined region and a dot matrix bitmap, which are 5 kV, 98-500 pA, one, 1 μs-100 μs and a format bitmap having 24 bits respectively.

Figure 8:
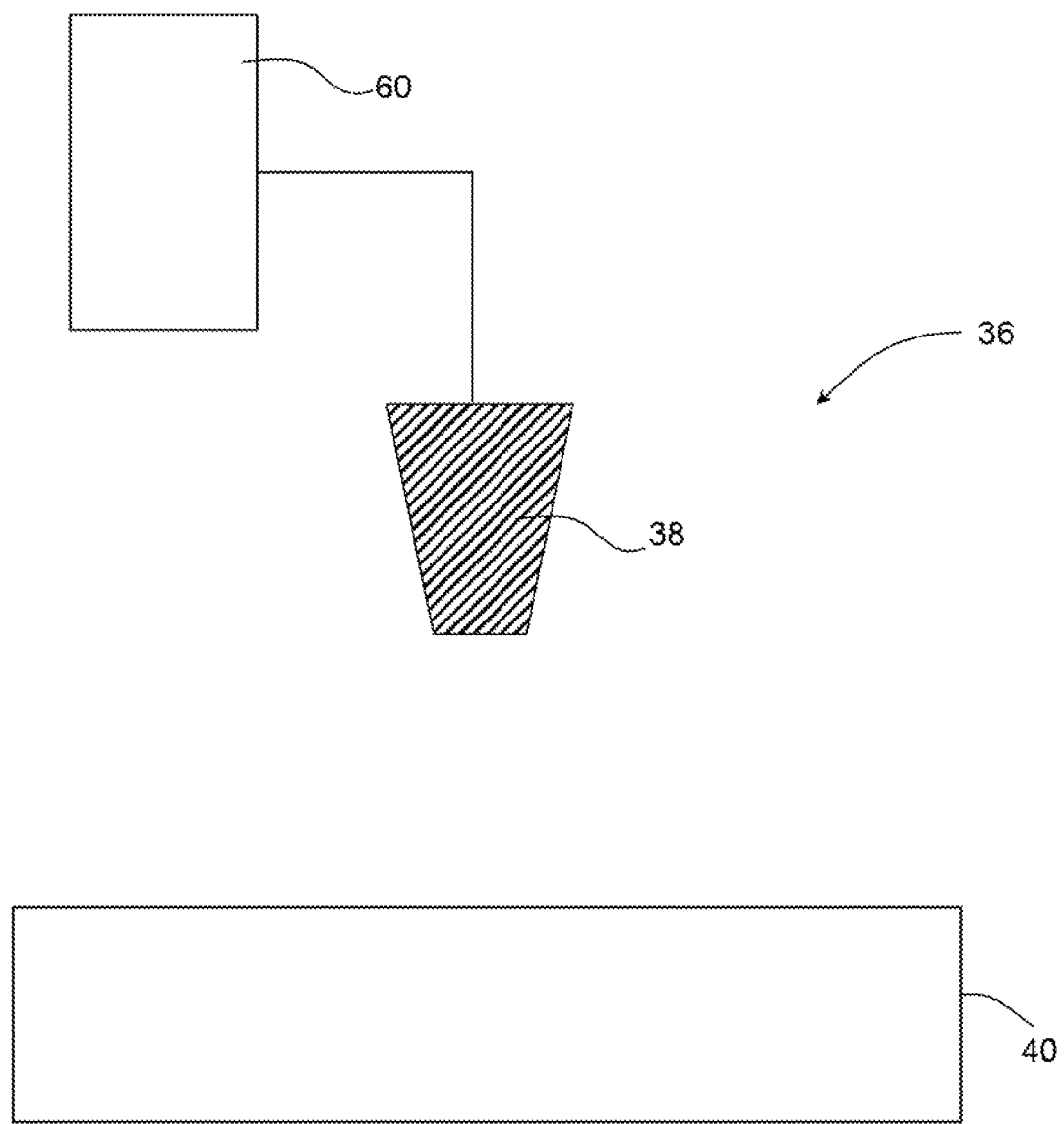
FIG. 8 is a diagram schematically showing the second configuration of the lithographic machine platform according to the present invention.

Refer to FIG. 8, which is a diagram schematically showing the second configuration of the lithographic machine platform according to the present invention. As shown in FIG. 8, an electron beam or an ion beam lithographic machine platform 36 comprises: at least one electron beam or at least one ion beam generator 38 generating at least one electron beam or at least one ion beam and a substrate supporting platform 40 positioned below the electron beam or the ion beam generator 38. In the embodiment, the number of the electron beam or the ion beam is one, which is used as an example. Besides, a laser localization system 60 is connected with the electron beam or ion beam generator 38 to control the projection direction of the electron beam or ion beam.

Figure 9A:
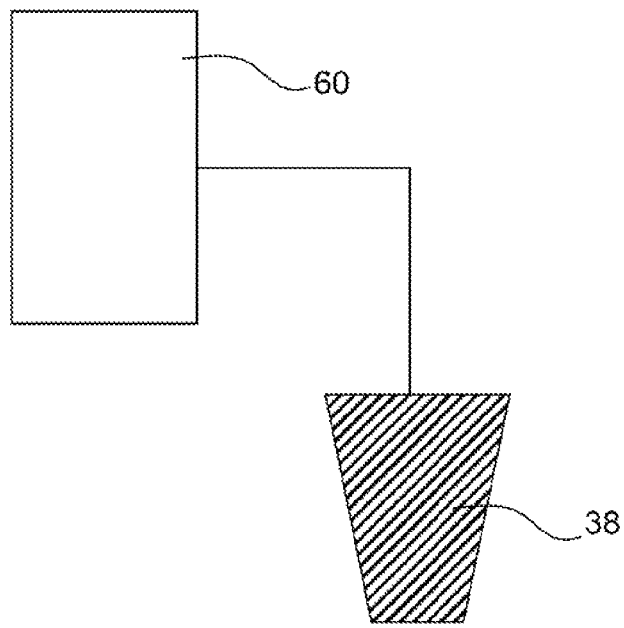
FIG. 9(a)-9(c) are diagrams schematically showing the steps of fabricating a patterned layer on a substrate by using the second configuration of the lithographic machine platform according to the present invention.
Figure 9A:
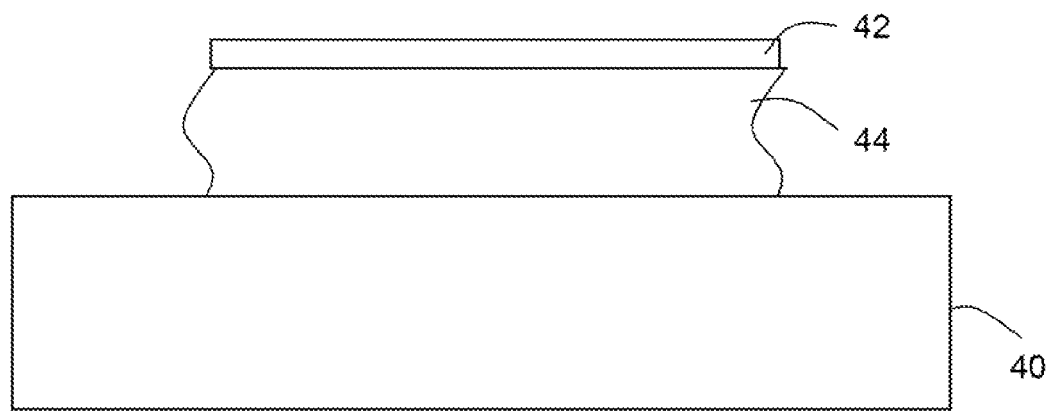
Figure 9B:
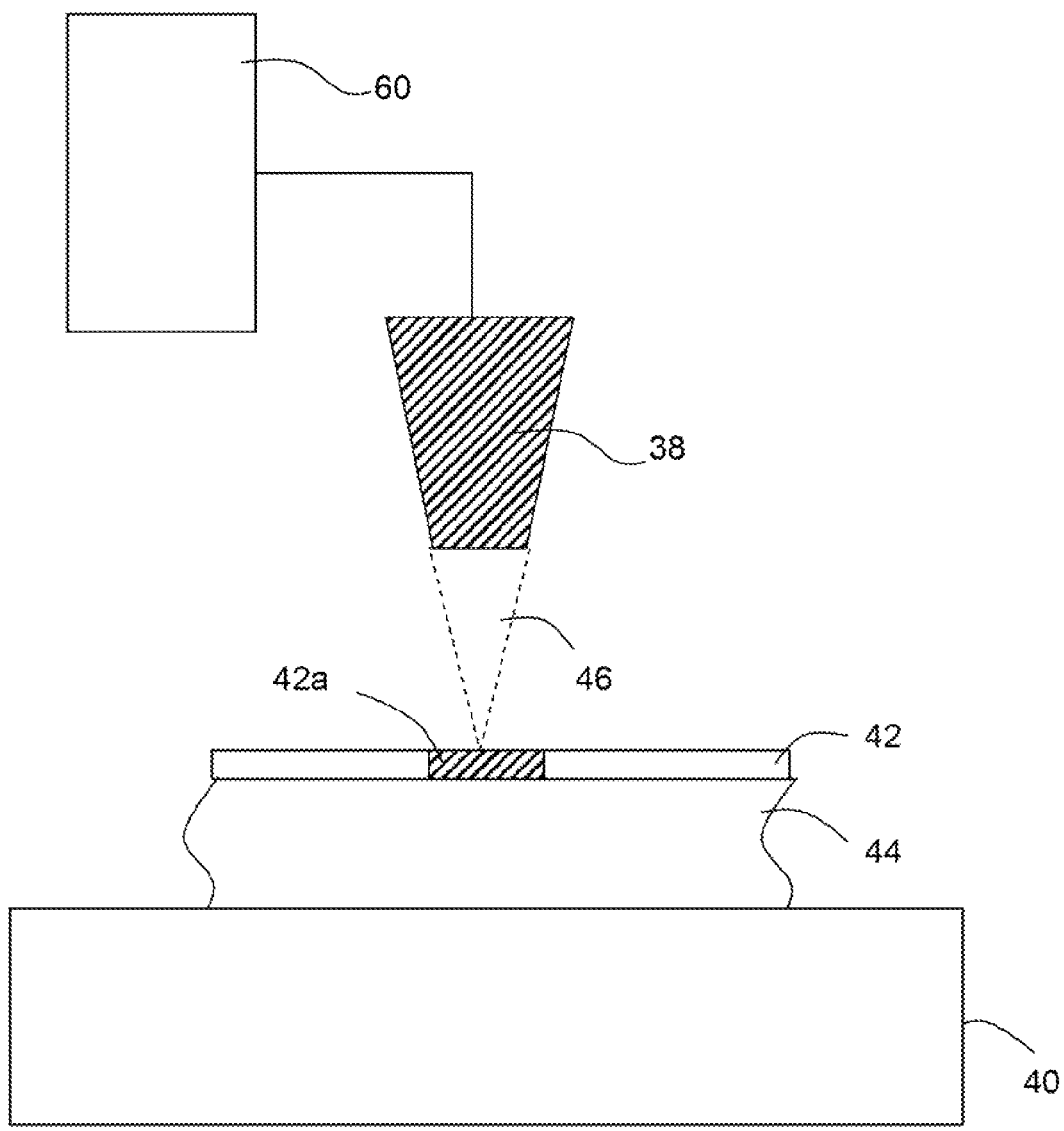
Figure 9:
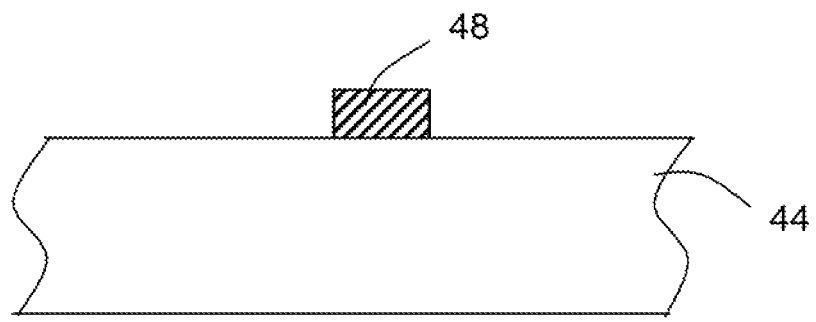
Figure 10:
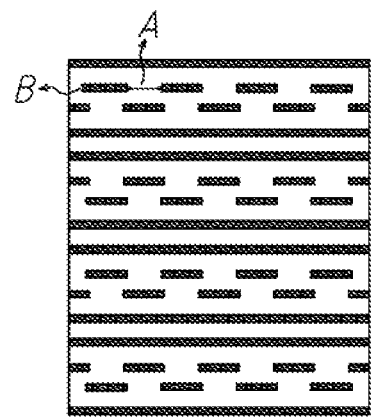
FIG. 10 is a layout diagram schematically showing an active layer of the SRAM according to the present invention.
Figure 11:
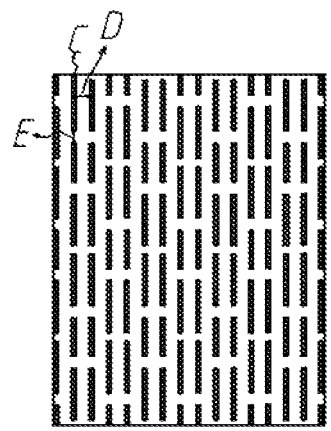
FIG. 11 is a layout diagram schematically showing metal gates of the SRAM according to the present invention.
Figure 12:
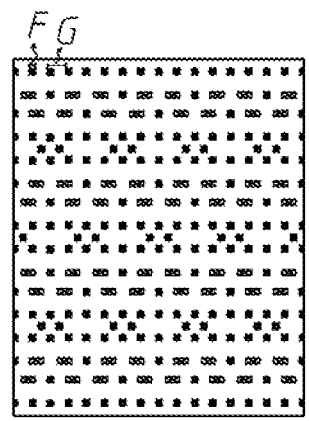
FIG. 12 is a layout diagram schematically showing contacts of the SRAM according to the present invention.
Figure 13:
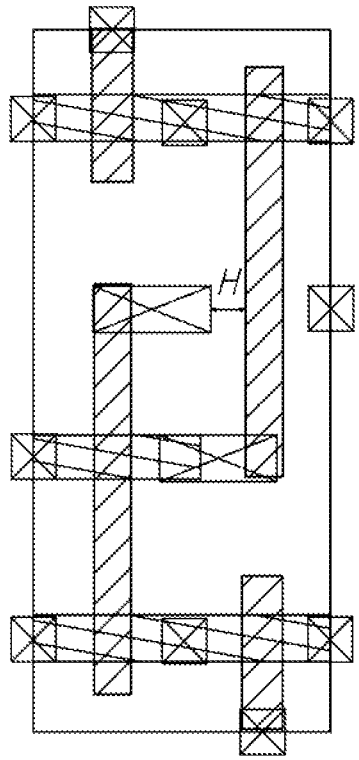
FIG. 13 is a layout diagram schematically showing the active layer, the metal gates and the contacts of SRAM according to the present invention.

Refer to FIGS. 9(a)-9(c), which are diagrams schematically showing the steps of fabricating a patterned layer on a substrate by using the second configuration of the lithographic machine platform according to the present invention. Firstly, as shown in FIG. 9(a), a semiconductor substrate 44 is supported on a substrate supporting machine platform 40, and a precursory layer 42 is formed on a surface of the semiconductor substrate 44, wherein semiconductor substrate 44 is selected from a silicon substrate, a germanium substrate, a substrate consisting of III-V group chemical compounds, or a substrate consisting of II-VI group chemical compounds, and the precursory layer 42 comprises metallic materials or dielectric materials. Next, as shown in FIG. 9(b), the laser localization system 60 controls the projection direction of the electron beam or the ion beam, such that a part of the precursory layer 42a is selectively reacted with the electron beam or the ion beam generated by the electron beam or the ion beam generator 38 according to the preset and defined patterns, and then the properties of the part of the precursory layer 42a is varied, such as the phase variation, the bonding variation, etc. Finally, as shown in FIG. 9(c), the precursory layer having different properties is selectively etched to form a patterned layer 48. The variation for the properties of the precursory layer 42 depends on a reactive energy, which is provided by the electron beam or the ion beam according to the scanning frequency and the staying time of a fixed point on a region of the preset and defined patterns.

In the abovementioned process, there is a plurality of electron beams or ion beams, and the speed of forming the patterned block is increased multiple times.

When the patterned layer is used as a hard mask layer, the hard mask layer is provided to the substrate 34 for proceeding with the subsequent patterned fabrication processes.

The present invention uses the abovementioned fabrication processes to fabricate SRAM, wherein the layouts an active layer, metal gates, and contacts of the SRAM are shown in FIGS. 10-13. From the figures, the minimum active line A, the minimum active space B, the minimum gate line C, the minimum gate pitch D, a gate end-to-end spacing E, the minimum contact size F, the minimum contact pitch and a gate to contact spacing H are respectively 20 nm, 44 nm, 18 nm, 65 nm, 30 nm, 20 nm, 50 nm, and 13 nm.

In conclusion, the present invention provides a lithographic machine platform and applications thereof, which forms a pattern with a high resolution on a substrate without having to acquire additional treatments, such as a film-forming resistive preparation treatment, a development and a hard mask treatment. The present invention has a great developing potential for the lithographic technology in the future.

The embodiments described above are only to exemplify the present invention but not to limit the scope of the present invention. Therefore, any equivalent modification or variation according to the shape, structures, characteristics and spirit disclosed in the present invention is to be also included within the scope of the present invention.

What is claimed is:

1. A method for fabricating a patterned layer comprising steps of:
   providing a semiconductor substrate;
   forming a precursory gas on said semiconductor substrate; and
   forming a patterned block on said semiconductor substrate by reacting said precursory gas with at least one electron beam or at least one ion beam.

2. The method for fabricating the patterned layer according to claim 1, wherein said precursory gas is selected from a precursory gas comprising metals or a precursory gas comprising a dielectric layer.

3. The method for fabricating the patterned layer according to claim 1, wherein said substrate is selected from a silicon substrate, a germanium substrate, a substrate consisting of III-V group chemical compounds, or a substrate consisting of II-VI group chemical compounds.

4. The method for fabricating the patterned layer according to claim 1, wherein said patterned block is used as a hard mask.

5. The method for fabricating the patterned layer according to claim 1, wherein said patterned block is a metal block or a dielectric block.

6. The method for fabricating the patterned layer according to claim 1, wherein said patterned block is a metal block comprising platinum, wolfram, titanium, or tantalum.

7. The method for fabricating the patterned layer according to claim 1, wherein said patterned block comprises silicon dioxide, silicon nitride, or silicon carbide.

8. The method for fabricating the patterned layer according to claim 1, wherein said at least one electron beam is a plurality of electron beams.

9. The method for fabricating the patterned layer according to claim 1, wherein said at least one ion beam is a plurality of ion beams.

10. A method for fabricating a patterned layer comprising steps of:
providing a semiconductor substrate;
forming a precursory gas on said semiconductor substrate; and
forming a small patterned block on said semiconductor substrate by reacting said precursory gas with at least one first electron beam or at least one first ion beam, and forming a photoresistant block on said semiconductor substrate to form a large patterned block.

11. The method for fabricating the patterned layer according to claim 10, wherein said small patterned block has a smallest width of less than 50 nm and said large patterned block has a smallest width of not less than 50 nm.

12. The method for fabricating the patterned layer according to claim 10, wherein in said step of forming said small patterned block and said large patterned block, said small patterned block is formed on said semiconductor substrate by reacting said precursory gas with said first electron beam or said first ion beam, and then said photoresistant block is formed on said semiconductor substrate and said photoresistant block is exposed to light to form said large patterned block.

13. The method for fabricating the patterned layer according to claim 10, wherein in said step of forming said small patterned block and said large patterned block, said photoresistant block is formed on said semiconductor substrate and said photoresistant block is exposed to light to form said large patterned block, and then said small patterned block is formed on said semiconductor substrate by reacting said precursory gas with said first electron beam or said first ion beam.

14. The method for fabricating the patterned layer according to claim 12, wherein said light is a varied shaped beam, a second electron beam, a second ion beam, or a Ultraviolet (UV) light.

15. A method for fabricating a patterned layer comprising steps:
providing a semiconductor substrate; and
forming a precursory gas on said semiconductor substrate to respectively form a small patterned block and a large patterned block on said semiconductor substrate by reacting said precursory gas with at least one first electron beam and at least one second electron beam.

16. The method for fabricating the patterned layer according to claim 15, wherein said small patterned block has a smallest width of less than 50 nm and said large patterned block has a smallest width of not less than 50 nm.

17. The method for fabricating the patterned layer according to claim 15, wherein a resolution of said first electron beam is smaller than 50 nm and a resolution of said second electron beam is not smaller than 50 nm.

18. The method for fabricating the patterned layer according to claim 15, wherein in said step of forming said precursory gas on said semiconductor substrate to respectively form said small patterned block and said large patterned block, said precursory gas is formed on said semiconductor substrate to form said small patterned block on said semiconductor substrate by reacting said precursory gas with said first electron beam, and then said large patterned block is formed on said semiconductor substrate by reacting said precursory gas with said second electron beam.

19. The method for fabricating the patterned layer according to claim 15, wherein in said step of forming said precursory gas on said semiconductor substrate to respectively form said small patterned block and said large patterned block, said precursory gas is formed on said semiconductor substrate to form said large patterned block on said semiconductor substrate by reacting said precursory gas with said second electron beam, and then said small patterned block is formed on said semiconductor substrate by reacting said precursory gas with said first electron beam.

20. The method for fabricating the patterned layer according to claim 15, wherein said at least one first electron beam is a plurality of first electron beams, and said at least one second electron beam is a plurality of second electron beams.

* * * * *